(12) United States Patent
Van Den Berg et al.

(10) Patent No.: US 8,394,513 B2
(45) Date of Patent: Mar. 12, 2013

(54) BODY COATED WITH HARD MATERIAL

(75) Inventors: Hendrikus Van Den Berg, Venlo-Blerick (NL); Hartmut Westphal, Dermbach/Rhoen (DE); Volkmar Sottke, Muelheim/Ruhr (DE)

(73) Assignee: Kennametal Inc., Latrobe, PA (US)

( * ) Notice: Subject to any disclaimer, the term of this patent is extended or adjusted under 35 U.S.C. 154(b) by 226 days.

(21) Appl. No.: 12/866,259

(22) PCT Filed: Jan. 20, 2009

(86) PCT No.: PCT/EP2009/000310
§ 371 (c)(1),
(2), (4) Date: Sep. 7, 2010

(87) PCT Pub. No.: WO2009/112116
PCT Pub. Date: Sep. 17, 2009

(65) Prior Publication Data
US 2011/0003126 A1    Jan. 6, 2011

(30) Foreign Application Priority Data
Mar. 12, 2008   (DE) .................. 10 2008 013 966

(51) Int. Cl.
*B32B 9/00* (2006.01)
(52) U.S. Cl. ............ 428/697; 51/307; 51/309; 428/698; 428/699; 428/701; 428/702
(58) Field of Classification Search ............ 51/307, 51/309; 428/697, 698, 699, 701, 702, 704
See application file for complete search history.

(56) References Cited

U.S. PATENT DOCUMENTS

| | | | |
|---|---|---|---|
| 6,040,012 A | 3/2000 | Anderbouhr et al. | |
| 6,382,951 B1 | 5/2002 | Soderberg et al. | |
| 6,572,991 B1 | 6/2003 | Ruppi | |
| 7,767,320 B2 * | 8/2010 | Endler | 428/697 |
| 2002/0136933 A1 | 9/2002 | Braendle | |
| 2007/0298280 A1 | 12/2007 | Omori | |
| 2009/0123779 A1 | 5/2009 | Endler | |
| 2009/0297835 A1 | 12/2009 | Okada et al. | |

FOREIGN PATENT DOCUMENTS

| | | |
|---|---|---|
| CN | 1316545 A | 10/2001 |
| EP | 0899359 A1 | 3/1999 |
| EP | 1122334 A1 | 8/2001 |
| EP | 1757389 A1 | 2/2007 |
| EP | 1825943 A1 | 8/2007 |
| WO | 0070120 A1 | 11/2000 |
| WO | WO03/085152 | 10/2003 |
| WO | 2007003648 A1 | 1/2007 |
| WO | 2008059896 A1 | 5/2008 |

OTHER PUBLICATIONS

Endler et al Novel aluminum-rich T(1-x)Al(x)N coatings by LPCVD. Surface & Coatings Techn 203 (2008) p. 530-533.*
Fox-Rabinovich et al "Effect of temperature of annealing below 900 C on structure, properties and tool life of an AlTiN coating under various cutting conditions". Surface & Coatings Techn 202 (2008) p. 2985-2992.*
Kutchej et al Structure, mechanical and tribological properties of sputtered Ti(1-x)Al(x)N coatings with 0.5<=x=<0.75. Surface & Coatings Techn 200 (2005) p. 23582365.*
Santana et al "The role of hcp-AlN on hardness behavior of Ti(1-x)Al(x)N nanpocomposite during annealing" ThinSolid Films 469-470 (2004) p. 399-344.*
Mayrhofer et al, Influence of the Al distribution on the structure, elastic properties, and phase stability of supersaturated Ti1-xAlxN, Journal of Applied Physics, 2006, pp. 6-10, vol. 100, 094906, American Institute of Physics.
Shimada et al, Preparation of (Ti1-xAlx)N films from mixed alkoxide solutions by plasma CVD, Thin Solid Films, 2000, vol. 370, pp. 146-150, Elsevier.
Byoung et al, High temperature oxidation of (Ti1-xAlx)N coatings made by plasma enhanced chemical vapor disposition, J. Vac. Sci. Technol. A, Jan./Feb. 1999, pp. 133-137, vol. 17, No. 1.
Sproul, William D., Physical vapor deposition tool coatings, Surface and Coatings Technology, 1996, pp. 1-7, vol. 81.
Lee et al., (Ti1-xAlx)N coatings by plasma-enhanced chemical vapor deposition, J. Vac. Sci. Technol. A, Jul./Aug. 1994, pp. 1602-1607, vol. 12, No. 4.

* cited by examiner

*Primary Examiner* — Archene Turner
(74) *Attorney, Agent, or Firm* — Matthew W. Gordon, Esq.

(57) ABSTRACT

The invention relates to a body which is coated with hard material and has a plurality of layers applied by means of CVD, wherein the outer layer comprises $Ti_{1-x}Al_xN$, $Ti_{1-x}Al_xC$ and/or $Ti_{1-x}Al_xCN$ where $0.65 \leq x \leq 0.9$, preferably $0.7 \leq x \leq 0.9$, and this outer layer has compressive stresses in the range from 100 to 1100 MPa, preferably from 400 to 800 MPa, and a TiCN or $Al_2O_3$ layer is arranged under this outer layer.

21 Claims, No Drawings

BODY COATED WITH HARD MATERIAL

CROSS REFERENCE TO RELATED APPLICATIONS

This application is the US national phase of PCT application PCT/EP2009/000310, filed 20 Jan. 2009, published 17 Sep. 2009 as 2009/112116, and claiming the priority of German patent application 102008013966.1 itself filed 12 Mar. 2008, whose entire disclosures are herewith incorporated by reference.

The invention relates to a body which is coated with hard material and has at least one hard material layer applied by means of CVD.

Cutting tools used for cutting machining have to meet demanding requirements in respect of stability and strength, in particular in the cutting machining of hard or tough materials such as tempered or hardened steels by turning at high cutting speeds. The material of the cutting tool should be, in particular, abrasion-resistant, which in the past has led to cemented carbide or cermet substrate bodies being provided with a surface coating, with initially carbides, nitrides or carbonitrides of titanium and later also aluminum oxide layers being used as wear protection coatings. Multilayer wear protection coatings composed of different hard materials are also known. For example, aluminum oxide layers arranged on one or more intermediate layers such as titanium carbonitride or titanium nitride are known as wear-reducing coatings.

WO 03/085152 A2 discloses the use of a Ti—Al—N layer which can be produced as a monophase layer having aluminum contents of up to 60% by means of PVD. At higher aluminum contents, however, a mixture of cubic and hexagonal TiAlN and at even higher aluminum contents only the softer and not wear-resistant hexagonal wurtzite structure is formed.

It is also known that single-phase $Ti_{1-x}Al_x$—N hard material layers in which x=0.9 can be produced by means of plasma CVD. However, the unsatisfactory homogeneity of the layer composition and the relatively high chlorine content of the layer are disadvantages.

When PVD or plasma CVD processes were used for producing $Ti_{1-x}Al_xN$ hard material layers, use of these layers was restricted to temperatures below 700° C. A disadvantage is that the coating of complicated component geometries presents difficulties. PVD is a directed process in which complex geometries are irregularly coated. Plasma CVD requires a high plasma homogeneity since the plasma power density has a direct influence on the Ti/Al atom ratio of the layer. Production of single-phase cubic $Ti_{1-x}Al_x$—N layers having a high aluminum content is not possible by means of the PVD processes used in industry.

Deposition of TiAl by means of a conventional CVD process at temperatures above 1000° C. is also not possible since the metastable $Ti_{1-x}Al_xN$ decomposes into TiN and hexagonal AlN at such high temperatures.

Finally, in the process described in U.S. Pat. No. 6,238,739 B1 for producing $Ti_{1-x}Al_xN$ layers in which x is in the range from 0.1 to 0.6 by means of a thermal CVD process without plasma assistance at temperatures in the range from 550° C. to 650° C., a limitation to relatively low aluminum contents with $x \leq 0.6$ is indicated. In the process described there, aluminum chlorides and titanium chlorides and also $NH_3$ and $H_2$ are used as gas mixtures. In the case of this coating, too, high chlorine contents of up to 12 atom % have to be accepted.

In order to improve the wear resistance and the oxidation resistance, WO 2007/003648 A1 proposes producing a body which is coated with hard material and has a single-layer or multilayer coating system which contains at least one $Ti_{1-x}Al_xN$ hard material layer by means of CVD, for which purpose the body is coated at temperatures of from 700° C. to 900° C. by means of CVD without plasma excitement in a reactor and titanium halides, aluminum halides and reactive nitrogen compounds which are mixed at elevated temperature are used as precursors. This gives a body having a single-phase $Ti_{1-x}Al_xN$ hard material layer having the cubic NaCl structure and a stoichiometry coefficient x of from >0.75 to 0.93 or a multiphase layer comprising $Ti_{1-x}Al_xN$ having the cubic NaCl structure and a stoichiometry coefficient x of from >0.75 to 0.93 as main phase and a wurtzite structure and/or $TiN_xNaCl$ structure as further phase. The chlorine content is in the range from 0.05 to 0.9 atom %. It is also known from this document that the $Ti_{1-x}Al_xN$ hard material layer or layers can contain up to 30% by mass of amorphous layer constituents. The hardness of the layers obtained is in the range from 2500 HV to 3800 HV.

To improve the adhesion of a $Ti_{1-x}Al_xN$ hard material layer at a high wear resistance, DE 10 2007 000 512, which is not a prior publication, also proposes that the layer system applied to a substrate body comprises a bonding layer of titanium nitride, titanium carbonitride or titanium carbide applied to the body, followed by a phase gradient layer and finally an outer layer of a single-phase or multiphase $Ti_{1-x}Al_xN$ hard material layer. The phase gradient layer comprises, on its side facing the bonding layer, a TiN/h-AlN phase mixture and with increasing layer thickness has an increasing proportion of fcc-TiAlN phase in a proportion of more than 50% and, associated therewith, a simultaneous decrease in the proportion of TiN and h-AlN phases.

A disadvantage of the abovementioned coatings is the short operating lives in the case of interrupted cutting such as milling, turning and drilling with cut interruption, in particular when cooling lubricants are used during cutting.

It is therefore an object of the present invention to provide a body which is coated with hard material and has improved heat resistance and cyclic fatigue strength.

This object is achieved by the body coated with hard material as claimed in claim 1. This body is characterized in that the outer layer comprises $Ti_{1-x}Al_xN$, $Ti_{1-x}Al_xC$ and/or $Ti_{1-x}Al_xCN$ where $0.65 \leq x \leq 0.9$, preferably $0.7 \leq x \leq 0.9$, and in that this outer layer has compressive stresses in the range from 100 to 1100 MPa, preferably from 400 to 800 MPa, and in that a TiCN or $Al_2O_3$ layer is arranged under this outer layer.

A layer of $Ti_{1-x}Al_xN$, $Ti_{1-x}Al_xC$ or $Ti_{1-x}Al_xCN$ which is applied by means of CVD is found to be extremely resistant to crack formation and crack growth, as encountered in the case of other coatings known and used in the prior art. The cemented carbides, cermets or ceramics used as substrate bodies have lower coefficients of expansion than TiCN and $Al_2O_3$, as a result of which tensile stresses arise in these hard material layers on cooling from coating temperatures of about 900° C. for TiCN and about 1000° C. for $Al_2O_3$. These tensile stresses are partly relieved by formation of crack structures. Cubic titanium aluminum nitride or titanium aluminum carbonitride has, as metastable crystal system, compressive stresses in the range from 100 to 1100 MPa, preferably from 400 to 800 MPa, after cooling from the coating temperatures and does not form a crack structure, which overall leads to this combination of the layers named in claim 1 being found to be extremely wear resistant. Combination of the known high abrasion resistances of TiCN and the low thermal conductivity and high oxidation resistance of $Al_2O_3$ with the likewise very abrasion- and oxidation-resistant titanium aluminum nitride or titanium aluminum carbonitride coating as outer layer having compressive residual stresses significantly improves the cutting durability in applications which involve high load changes and high temperatures changes. Examples are milling and also turning and drilling with is interruptions or changing cut cross sections, in particular when using cooling lubricants.

Embodiments of the present invention are described in the dependent claims.

Thus, the $Ti_{1-x}Al_xN$ layer, the $Ti_{1-x}Al_xC$ layer or the $Ti_{1-x}Al_xCN$ layer can consist of a single phase and have a cubic structure or consist of a plurality of phases and comprise a cubic main phase together with a further phase having the wurtzite structure and/or TiN having the NaCl structure.

The abovementioned titanium aluminum nitride or carbonitride layer can have up to 30% by mass of amorphous layer constituents. The chlorine content of the titanium aluminum nitride or titanium aluminum carbonitride layer is preferably in the range from 0.01 to 3 atom %.

In a further embodiment of the present invention, a multilayer coating comprising layers which each have a thickness of from 1 nm to 5 nm and have an identical or changing, preferably alternating, composition can also be used as outer layer. The individual layers in the coating are titanium aluminum carbonitride and titanium aluminum nitride layers, with the total thickness of these layers, which forms the outermost coating, being in the range from 1 μm to 5 μm.

A gradient can also be created in the individual layers by means of a changing gas atmosphere while coating proceeds, as a result of which the carbon content increases or decreases continually from the inside to the outside in subregions. The total thickness of all layers applied to the substrate body composed of cemented carbide, cermet or a ceramic should be in the range from 5 μm to 25 μm.

For the purposes of the present invention, the titanium aluminum nitride or titanium aluminum carbonitride layer can contain up to 25% of hexagonal AlN.

To produce the body coated with hard material according to the invention, a cemented carbide or cermet body is introduced at coating temperatures in the range from 700° C. to 900° C. into a gas atmosphere containing, in addition to carrier gases, titanium chloride, methane and ammonia for the application of TiCN or aluminum chloride and carbon dioxide for the application of aluminum oxide. After production of a bonding layer on one of the abovementioned substrates or a TiCN base layer, on which an $Al_2O_3$ layer is applied, aluminum chloride, titanium chloride, ammonia and ethene are introduced into the gas atmosphere to apply the outermost layer. Preferred layer thicknesses are in the range from 2 to 5 μm. The layer thickness of all layers is from 2 to 10 μm, preferably from 3 to 7 μm.

The invention claimed is:

1. A body coated with hard material and having a plurality of layers applied by CVD, wherein the outer layer comprises CVD $Ti_{1-x}Al_xN$, $Ti_{1-x}Al_xC$ and/or $Ti_{1-x}Al_xCN$ where $0.65 \leq x \leq 0.9$, and in that this outer layer has compressive stresses in the range from 100 to 1100 MPa, and in that a CVD $Al_2O_3$ layer is arranged under this outer layer.

2. The body coated with hard material as claimed in claim 1, wherein the $Ti_{1-x}Al_xN$ layer, the $Ti_{1-x}Al_xC$ layer or the $Ti_{1-x}Al_xCN$ layer consists of a single phase and has a cubic structure or consists of a plurality of phases and comprises a cubic main phase together with a further phase having the wurzite structure and/or comprises TiN.

3. The body coated with hard material as claimed in claim 1 wherein up to 30% by mass of amorphous layer constituents are present in the outer layer.

4. The body coated with hard material as claimed in claim 1 wherein the chlorine content of the outer layer is in the range from 0.01 to 3 atom %.

5. The body coated with hard material as claimed in claim 1 wherein the outer layer comprises a plurality of layers which each have a thickness of from 1 to 5 nm and have an identical or changing composition selected from among $Ti_{1-x}Al_xN$, $Ti_{1-x}Al_xC$ and $Ti_{1-x}Al_xCN$ and in that this outer layer has a total thickness from 1 μm to 5 μm.

6. The body coated with hard material as claimed in claim 1 wherein the total thickness of all layers which have been applied to a substrate body composed of cemented carbide, cermet or a ceramic is in the range from 5 μm to 25 μm.

7. The body coated with hard material as claimed in claim 1 wherein the $Ti_{1-x}Al_xN$ layer, $Ti_{1-x}Al_xC$ layer or the $Ti_{1-x}Al_xCN$ layer contains up to 25% of hexagonal AlN.

8. The body coated with hard material as claimed in claim 1, wherein $0.7 \leq x \leq 0.9$.

9. The body coated with hard material as claimed in claim 1 wherein the outer layer has compressive stresses in the range from 400 to 800 MPa.

10. The body coated with hard material as claimed in claim 5 wherein the layers of the outer layer are of alternating composition.

11. The body coated with hard material as claimed in claim 1 wherein the CVD $Al_2O_3$ layer is applied to a TiCN layer.

12. A body coated with hard material and having a plurality of layers applied by CVD, wherein the outer layer comprises CVD $Ti_{1-x}Al_xN$, $Ti_{1-x}Al_xC$ and/or $Ti_{1-x}Al_xCN$ where $0.65 \leq x \leq 0.9$, and in that this outer layer has compressive stresses in the range from 100 to 1100 MPa, and in that a CVD TiCN is arranged under this outer layer.

13. The body coated with hard material as claimed in claim 12, wherein the $Ti_{1-x}Al_xN$ layer, the $Ti_{1-x}Al_xC$ layer or the $Ti_{1-x}Al_xCN$ layer consists of a single phase and has a cubic structure or consists of a plurality of phases and comprises a cubic main phase together with a further phase having the wurzite structure and/or comprises TiN.

14. The body coated with hard material as claimed in claim 12, wherein up to 30% by mass of amorphous layer constituents are present in the outer layer.

15. The body coated with hard material as claimed in claim 12, wherein the chlorine content of the outer layer is in the range from 0.01 to 3 atom %.

16. The body coated with hard material as claimed in claim 12, wherein the outer layer comprises a plurality of layers which each have a thickness of from 1 to 5 nm and have an identical or changing composition selected from among $Ti_{1-x}Al_xN$, $Ti_{1-x}Al_xC$ and $Ti_{1-x}Al_xCN$ and in that this outer layer has a total thickness from 1 μm to 5 μm.

17. The body coated with hard material as claimed in claim 12, wherein the total thickness of all layers which have been applied to a substrate body composed of cemented carbide, cermet or a ceramic is in this range from 5 μm to 25 μm.

18. The body coated with hard material as claimed in claim 12, wherein the $Ti_{1-x}Al_xN$ layer, $Ti_{1-x}Al_xC$ layer or the $Ti_{1-x}Al_xCN$ layer contains up to 25% of hexagonal AlN.

19. The body coated with hard material as claimed in claim 12, wherein $0.7 \leq x \leq 0.9$.

20. The body coated with hard material as claimed in claim 12, wherein the outer layer has compressive stresses in the range from 400 to 800 MPa.

21. The body coated with hard material as claimed in claim 16, wherein the layers of the outer layer are of alternating composition.

* * * * *